US010290705B2

(12) United States Patent
Huang et al.

(10) Patent No.: US 10,290,705 B2
(45) Date of Patent: May 14, 2019

(54) LATERALLY DIFFUSED METAL OXIDE SEMICONDUCTOR FIELD-EFFECT TRANSISTOR AND MANUFACTURING METHOD THEREFOR

(71) Applicant: CSMC TECHNOLOGIES FAB2 CO., LTD., Wuxi New District (CN)

(72) Inventors: Feng Huang, Wuxi New District (CN); Guangtao Han, Wuxi New District (CN); Guipeng Sun, Wuxi New District (CN); Feng Lin, Wuxi New District (CN); Longjie Zhao, Wuxi New District (CN); Huatang Lin, Wuxi New District (CN); Bing Zhao, Wuxi New District (CN)

(73) Assignee: CSMC TECHNOLOGIES FAB2 CO., LTD., Wuxi New District, Jiangsu (CN)

( * ) Notice: Subject to any disclaimer, the term of this patent is extended or adjusted under 35 U.S.C. 154(b) by 0 days.

(21) Appl. No.: 15/564,181

(22) PCT Filed: Jan. 29, 2016

(86) PCT No.: PCT/CN2016/072853
§ 371 (c)(1),
(2) Date: Oct. 3, 2017

(87) PCT Pub. No.: WO2016/161842
PCT Pub. Date: Oct. 13, 2016

(65) Prior Publication Data
US 2018/0130877 A1 May 10, 2018

(30) Foreign Application Priority Data

Apr. 10, 2015 (CN) .......................... 2015 1 0169433

(51) Int. Cl.
*H01L 29/66* (2006.01)
*H01L 29/78* (2006.01)
(Continued)

(52) U.S. Cl.
CPC .... *H01L 29/0649* (2013.01); *H01L 21/76229* (2013.01); *H01L 29/66681* (2013.01); *H01L 29/7816* (2013.01)

(58) Field of Classification Search
CPC ..... H01L 29/06; H01L 29/0649; H01L 21/76; H01L 21/76229; H01L 29/66; H01L 29/78; H01L 29/66681; H01L 29/7816
(Continued)

(56) References Cited

U.S. PATENT DOCUMENTS 6,262,459 B1  7/2001  Tung
8,212,329 B2  7/2012  Mallikarjunaswamy et al.
(Continued)

FOREIGN PATENT DOCUMENTS

CN  101572271 A  11/2009
CN  102130170 A  7/2011
(Continued)

OTHER PUBLICATIONS

International Search Report and English Translation thereof for International Application No. PCT/CN2016/072853, dated May 6, 2016 (6 pages).
(Continued)

*Primary Examiner* — Fazli Erdem
(74) *Attorney, Agent, or Firm* — Hamre, Schumann, Mueller & Larson, P.C.

(57) ABSTRACT

Provided are a laterally diffused metal oxide semiconductor field-effect transistor and a manufacturing method therefor. The method comprises: providing a wafer on which a first N well (22), a first P well (24) and a channel region shallow
(Continued)

trench isolating structure (42) are formed; forming a high-temperature oxidation film on the surface of the wafer by deposition; photoetching and dryly etching the high-temperature oxidation film, and reserving a thin layer as an etching buffer layer; performing wet etching, removing the etching buffer layer in a region which is not covered by a photoresist, and forming a mini oxidation layer (52); performing photoetching and ion injection to form a second N well (32) in the first N well and form a second P well (34) in the first P well; forming a polysilicon gate (62) and a gate oxide layer on the surface of the wafer; and photoetching and injecting N-type ions to form a drain electrode (72) and a source electrode (74).

12 Claims, 2 Drawing Sheets

(51) Int. Cl.
*H01L 21/76* (2006.01)
*H01L 29/06* (2006.01)
*H01L 21/762* (2006.01)

(58) Field of Classification Search
USPC .......................................................... 257/337
See application file for complete search history.

(56) References Cited

U.S. PATENT DOCUMENTS

2012/0313166 A1    12/2012   Ito
2017/0358657 A1*   12/2017   Huang ................... H01L 29/78

FOREIGN PATENT DOCUMENTS

| CN | 102254946 A | 11/2011 |
| CN | 102769037 A | 11/2012 |
| CN | 102790089 A | 11/2012 |
| CN | 103151386 A | 6/2013 |

OTHER PUBLICATIONS

Chinese Office Action and English Translation thereof for Chinese Counterpart Application No. 201510169433.4, dated Aug. 1, 2018 (7 pages).

* cited by examiner

LATERALLY DIFFUSED METAL OXIDE SEMICONDUCTOR FIELD-EFFECT TRANSISTOR AND MANUFACTURING METHOD THEREFOR

FIELD OF THE INVENTION

The present disclosure relates to semiconductor processes, and more particularly relates to a laterally diffused metal oxide semiconductor field-effect transistor, and a manufacturing method of the laterally diffused metal oxide semiconductor field-effect transistor.

BACKGROUND OF THE INVENTION

With regard to the laterally diffused metal oxide semiconductor field-effect transistors (LDMOSFET), one of these structures forms a shallow trench isolation (STI) structure between a drain and a source, which is referred to as a STI structure laterally diffused metal oxide semiconductor field-effect transistor. Since the device requires to have a high breakdown voltage (off-BV) in some applications, it is an urgent problem to increase the off-BV of the device without increasing the area of LDMOS.

SUMMARY OF THE INVENTION

Accordingly, it is necessary to provide a STI structure laterally diffused metal oxide semiconductor field-effect transistor having a high off-BV.

A method of manufacturing a laterally diffused metal oxide semiconductor field-effect transistor includes: providing a wafer having a first N well, a first P well, and a channel region shallow trench isolation structure formed thereon; depositing a high temperature oxide film on a surface of the wafer; performing lithography and dry etching to the high temperature oxide film, wherein a thickness of the removed high temperature oxide film by etching is less than a thickness of the high temperature oxide film, such that a region not covered by a photoresist preserves a layer of the high temperature oxide film serving as an etching buffer layer; performing wet etching to remove the etching buffer layer, such that a remaining high temperature oxide film forms a mini-oxide layer under the photoresist; performing lithography and ion implantation for a second N well and a second P well, thereby forming the second N well in the first N well, and forming the second P well in the first P well; wherein the channel region shallow trench isolation structure extends downwardly from a surface of the second N well to an interior thereof, the mini-oxide layer is located on the N well, and one end of the mini-oxide layer is in contact with a first end of the channel region shallow trench isolation structure, the first end of the channel region shallow trench isolation structure is an end adjacent to the first P well; forming a polysilicon gate and a gate oxide layer on the surface of the wafer; wherein one end of the polysilicon gate and the gate oxide layer is in contact with the second P well, and the other end thereof extends to the first end of the channel region shallow trench isolation structure and covers the mini-oxide layer; and performing lithography and implanting N-type ions, thereby forming a drain in the second N well adjacent to a second end of the channel region shallow trench isolation structure opposite to the first end, and forming a source in the second P well simultaneously.

A high off-BV laterally diffused metal oxide semiconductor field-effect transistor includes a substrate, a first N well and a first P well in the substrate, a second N well on a surface of the first N well, a second P well on a surface of the first P well, and a shallow trench isolation structure on the substrate. The shallow trench isolation structure includes a channel region shallow trench isolation structure extending downwardly from a surface of the second N well to an interior thereof. The laterally diffused metal oxide semiconductor field-effect transistor further includes a source disposed on a surface of the second P well, a drain disposed on a surface of the second N well and located at a position adjacent to one end of the channel region shallow trench isolation structure away from the second P well, and a gate including a polysilicon gate and a gate oxide layer. One end of the gate is in contact with the second P well, and the other end thereof extends to the channel region shallow trench isolation structure. The laterally diffused metal oxide semiconductor field-effect transistor further includes a mini-oxide layer. One end of the mini-oxide layer is in contact with one end of the channel region shallow trench isolation structure adjacent to the second P well, the other end thereof extends to the second N well, and the mini-oxide layer is covered by the polysilicon gate.

According to the aforementioned laterally diffused metal oxide semiconductor field-effect transistor and the manufacturing method thereof, by adding a mini-oxide layer at one side of the channel region of the STI structure LDMOS adjacent to the drift region, the off-BV of the LDMOS can be greatly increased without increasing the area of the LDMOS.

BRIEF DESCRIPTION OF THE DRAWINGS

To illustrate the technical solutions according; to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present. As used herein, the terms "vertical", "horizontal", "left", "right" and similar expressions are for illustrative purposes only.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "and/or" as used herein includes any and all combinations of one or more of the associated listed items.

Figure 1:
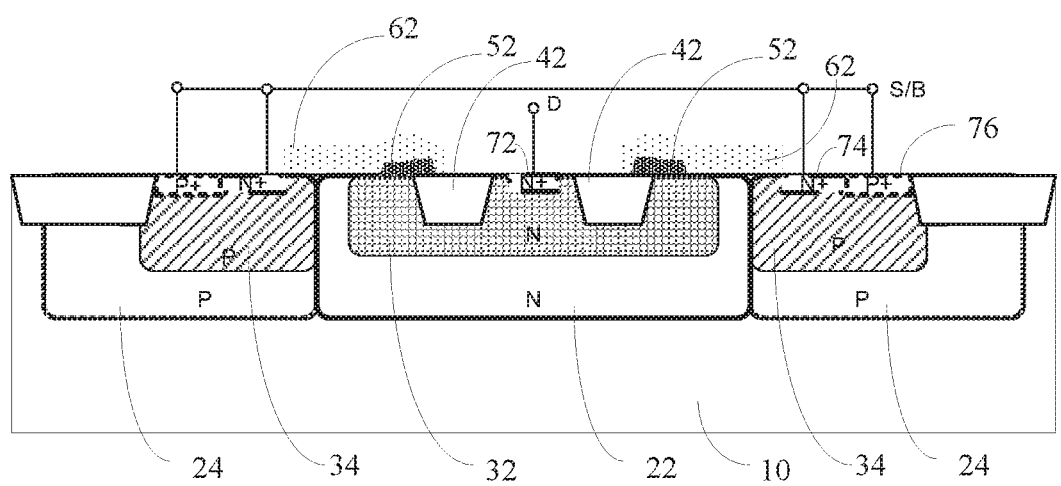
FIG. 1 is a cross-sectional view of a laterally diffused metal oxide semiconductor field-effect transistor according to one embodiment.

FIG. 1 is a cross-sectional view of a laterally diffused metal oxide semiconductor field-effect transistor according to one embodiment. An N-channel LDMOS is illustrated, which includes a substrate 10, a first N well 22 and a first P well 24 in the substrate 10, a second N well 32 on a surface of the first N well 22, a second P well 34 on a surface of the first P well 24, a shallow trench isolation structure on the substrate 10. The shallow trench isolation structure includes a channel region shallow trench isolation structure 42 extending downwardly from a surface of the second N well 32 to an interior thereof. The laterally diffused metal oxide semiconductor field-effect transistor further includes a source 74 disposed on a surface of the second P well 34, a drain 72 disposed on a surface of the second N well 32 and located at a position adjacent to one end of the channel region shallow trench isolation structure 42 away from the second P well 34, and a gate including a polysilicon gate 62 and a gate oxide layer (not shown in FIG. 1). One end of the gate is in contact with the second P well 34, and the other end thereof extends to the channel region shallow trench isolation structure 42. The laterally diffused metal oxide semiconductor field-effect transistor further includes a mini-oxide layer 52. One end of the mini-oxide layer 52 is in contact with one end of the channel region shallow trench isolation structure 42 adjacent to the second P well 34 (i.e., one end away from of the drain 72), the other end thereof extends to the second N well 32. The mini-oxide layer 52 is covered by the polysilicon gate 52. The laterally diffused metal oxide semiconductor field-effect transistor shown in FIG. 1 is a left-right symmetric structure. The laterally diffused metal oxide semiconductor field-effect transistor further includes a P-type highly doped region 76 located in the second P well 34 and located at one side of the source 74 away from the gate.

According to the aforementioned laterally diffused metal oxide semiconductor field-effect transistor and the manufacturing method thereof, by adding a mini-oxide layer 52 at one side of the channel region of the STI structure LDMOS adjacent to the drift region, the off-BV of the LDMOS can be greatly increased without increasing the area of the LDMOS.

Figure 2:
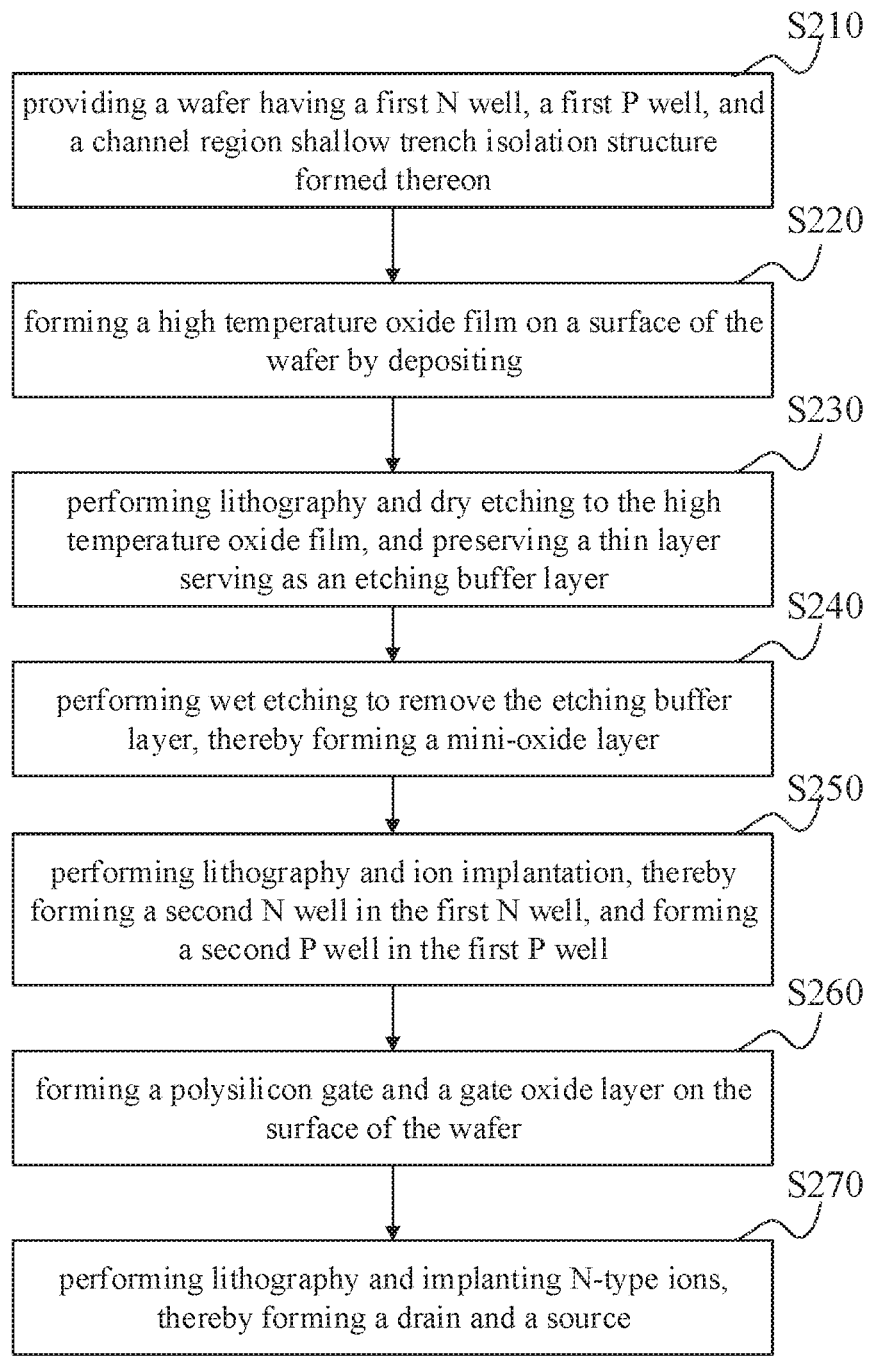
FIG. 2 is a flow chart of a method of manufacturing the laterally diffused metal oxide semiconductor field-effect transistor according to one embodiment.

A method of manufacturing the aforementioned LDMOS-FET is also provided. FIG. 2 is a flow chart of a method of manufacturing the laterally diffused metal oxide semiconductor field-effect transistor according to one embodiment, the method includes the following steps:

In step S210, a wafer having a first N well, a first P well, and a shallow trench isolation structure formed thereon is provided.

In the illustrated embodiment, after providing a silicon substrate wafer, the shallow trench isolation structure is formed by a process known to a person skilled in the art, and then the first N well and the first P well are formed by lithography and ion implantation. The laterally diffused metal oxide semiconductor field-effect transistor is a STI structure LDMOS, thus the shallow trench isolation structure includes a channel region shallow trench isolation structure disposed between a source and a drain. The first N well and the first P well are high voltage N well (HV N_well) and high voltage P well (HV P_well), respectively.

In step S220, a high temperature oxide film is formed on a surface of the wafer by deposition.

In the illustrated embodiment, the high temperature oxide (HTO) film is a silicon dioxide or silicon oxides of other valence states which are simultaneously produced) formed by depositing at a temperature of 750° C. to 850° C. using a low temperature furnace tube, and $SiH_2Cl_2$ and $N_2O$ are used as reaction gases.

In the illustrated embodiment, prior to performing the step S220, the method further includes a step of performing planarization processing to the surface of the wafer. Specifically, chemical mechanical polishing (CMP) can be performed. After the CMP is completed, it is ensured that an edge of the channel region shallow trench isolation structure is 200 angstroms to 400 angstroms higher than a surrounding substrate (an active region).

In step S230, lithography and dry etching are performed to the high temperature oxide film, and a thin layer is preserved to serve as an etching buffer layer.

By using two-step etching scheme, dry etching is performed first in step S230. A thickness of the removed high temperature oxide film by etching is less than a thickness of the high temperature oxide film. The high temperature oxide film remaining in a region which is not covered by a photoresist serves as the etching buffer layer, which will be removed at the second step of etching, i.e., wet etching. In the illustrated embodiment, the preserved etching buffer layer has a thickness of 70 angstroms to 150 angstroms.

In step S240, wet etching is performed, the etching buffer layer not covered by the photoresist is removed to form a mini-oxide layer.

After the wet etching is completed, the edge of the channel region shallow trench isolation structure should be 200 angstroms to 400 angstroms higher than a surface of the surrounding active region thereof, otherwise it will have a negative effect on the performance of the low voltage device.

In the illustrated embodiment, the wet etching is performed using a method of fixing an etching time (by-time) to prevent the STI from etched due to over etching.

In step S250, lithography and ion implantation are performed to form a second N well in the first N well and form a second P well in the first P well.

The channel region shallow trench isolation structure extends downwardly from a surface of the second N well to an interior thereof. The mini-oxide layer is located on the second N well, and one end of the mini-oxide layer is in contact with a first end of the channel region shallow trench isolation structure. The first end is an end of the channel region shallow trench isolation structure adjacent to the first P well.

In step S260, a polysilicon gate and a gate oxide layer are formed on the surface of the wafer.

One end of the polysilicon gate and the gate oxide layer is in contact with the second P well, and the other end thereof extends to the first end of the channel region shallow trench isolation structure and covers the mini-oxide layer.

In step S270, lithography is performed and N-type ions are implanted to form the drain and the source.

The drain is formed in the second N well adjacent to a second end of the channel region shallow trench isolation structure opposite to the first end, and the source is formed in the second P well simultaneously. The polysilicon gate forms a barrier to ions during implantation, thus the source merely needs to extend to an edge position below the polysilicon gate.

In the illustrated embodiment, the drain and the source formed by the implantation are N+ regions.

After the step S270 is completed, lithography as well as P-type ions implantation are performed, thus a P-type highly doped region is formed in the second P well and formed at one side of the source away from the gate.

The aforementioned method of manufacturing the laterally diffused metal oxide semiconductor field-effect transistor adopts a two-step etching scheme. The majority of the high temperature oxide films are firstly removed by dry etching, and then the remaining high temperature oxide films are removed by wet etching. With respect to the use of the wet etching alone, which is an isotropic etching, the amount of the etching to HTO can be controlled more stable and accurate in the aforementioned method, since the dry etching is an anisotropic etching. The remaining HTO after dry etching is removed by slight wet etching, and the amount of the laterally HTO etching caused by the slight wet etching can be ignored. With respect to the separate dry etching, the aforementioned method will not etch part of the channel region shallow trench isolation structure due to over etching, avoiding the negative effects on the low voltage device.

In one embodiment, a thermal drive-in to the first P well and the first N well can be performed after the step S220 and prior to the step 240. The high temperature process can make the high temperature oxide film become dense, which can reduce the wet etching rate of the high temperature oxide film. It is ensured that the amount of the etching of the mini-oxide layer preserved after the HTO film etching can be stably controlled during the subsequent cleaning process, so as to ensure the stability of mass production. In one embodiment, the temperature for thermal drive-in is more than or equal to 1000° C., and a duration is more than or equal to 60 minutes.

Although the description is illustrated and described herein with reference to certain embodiments, the description is not intended to be limited to the details shown. Modifications may be made in the details within the scope and range equivalents of the claims.

What is claimed is:

1. A method of manufacturing a laterally diffused metal oxide semiconductor field-effect transistor, comprising:
   providing a wafer having a first N well, a first P well, and a channel region shallow trench isolation structure formed thereon;
   depositing a high temperature oxide film on a surface of the wafer;
   performing lithography and dry etching to the high temperature oxide film, wherein a thickness of the removed high temperature oxide film by etching is less than a thickness of the high temperature oxide film, such that a region not covered by a photoresist preserves a layer of the high temperature oxide film serving as an etching buffer layer;
   performing wet etching to remove the etching buffer layer, such that a remaining high temperature oxide film forms a mini-oxide layer under the photoresist;
   performing lithography and ion implantation for a second N well and a second P well, thereby forming the second N well in the first N well, and forming the second P well in the first P well;
   wherein the channel region shallow trench isolation structure extends downwardly from a surface of the second N well to an interior thereof, the mini-oxide layer is located on the N well, and one end of the mini-oxide layer is in contact with a first end of the channel region shallow trench isolation structure, the first end of the channel region shallow trench isolation structure is an end adjacent to the first P well;
   forming a polysilicon gate and a gate oxide layer on the surface of the wafer; wherein one end of the polysilicon gate and the gate oxide layer is in contact with the second P well, the other end thereof extends to the first end of the channel region shallow trench isolation structure and covers the mini-oxide layer; and
   performing lithography and implanting N-type ions, thereby forming a drain in the second N well adjacent to a second end of the channel region shallow trench isolation structure opposite to the first end thereof, and forming a source in the second P well simultaneously.

2. The method according to claim 1, wherein during the step of performing lithography and dry etching to the high temperature oxide film, a preserved etching buffer layer has a thickness of 70 angstroms to 150 angstroms.

3. The method according to claim 1, wherein after the step of performing wet etching, an edge of the channel region shallow trench isolation structure is 200 angstroms to 400 angstroms higher than a surface of the first N well.

4. The method according to claim 1, wherein during the step of depositing the high temperature oxide film on the surface of the wafer, a silicon dioxide is formed at a temperature of 750° C. to 850° C. by depositing.

5. The method according to claim 4, wherein reaction gases used in the step of depositing the high temperature oxide film on the surface of the wafer are $N_2O$ and $SiH_2Cl_2$.

6. The method according to claim 1, wherein after the step of depositing the high temperature oxide film on the surface of the wafer and prior to the step of performing wet etching, the method further comprises a step of performing a thermal drive-in to the wafer.

7. The method according to claim 1, wherein during the step of performing wet etching, the etching is performed using a method of fixing an etching time.

8. The method according to claim 1, further comprising a step of performing chemical mechanical polishing to the surface of the wafer prior to the step of depositing the high temperature oxide film on the surface of the wafer.

9. The method according to claim 6, wherein during the step of performing the thermal drive-in to the wafer, a temperature is more than or equal to 1000° C. and a duration is more than or equal to 60 minutes.

10. The method according to claim 2, wherein after the step of performing wet etching, an edge of the channel region shallow trench isolation structure is 200 angstroms to 400 angstroms higher than a surface of the first N well.

11. A laterally diffused metal oxide semiconductor field-effect transistor, comprising a substrate, a first N well and a first P well located in the substrate, a second N well located on a surface of the first N well, a second P well located on a surface of the first P well, and a channel region shallow trench isolation structure located on the substrate, wherein the channel region shallow trench isolation structure extends downwardly from a surface of the second N well to an interior thereof; the laterally diffused metal oxide semiconductor field-effect transistor further comprises a source disposed on a surface of the second P well, a drain disposed on a surface of the second N well and located at a position adjacent to one end of the channel region shallow trench isolation structure away from the second P well, and a gate comprising a polysilicon gate and a gate oxide layer, wherein one end of the gate is in contact with the second P well, and the other end thereof extends to the channel region shallow trench isolation structure, wherein the laterally diffused metal oxide semiconductor field-effect transistor further comprises a mini-oxide layer, one end of the mini-oxide layer is in contact with one end of the channel region shallow trench isolation structure adjacent to the second P well, the other end thereof extends to the second N well, and the mini-oxide layer is covered by the polysilicon gate.

12. The laterally diffused metal oxide semiconductor field-effect transistor according to claim 11, wherein the laterally diffused metal oxide semiconductor field-effect transistor is an N-channel laterally diffused metal oxide semiconductor field-effect transistor.

* * * * *